(12) United States Patent
Tadatomo et al.

(10) Patent No.: US 7,053,420 B2
(45) Date of Patent: May 30, 2006

(54) GAN GROUP SEMICONDUCTOR LIGHT-EMITTING ELEMENT WITH CONCAVE AND CONVEX STRUCTURES ON THE SUBSTRATE AND A PRODUCTION METHOD THEREOF

(75) Inventors: Kazuyuki Tadatomo, Itami (JP); Hiroaki Okagawa, Itami (JP); Yoichiro Ouchi, Itami (JP); Takashi Tsunekawa, Itami (JP)

(73) Assignee: Mitsubishi Cable Industries, Ltd., Itami (JP)

( * ) Notice: Subject to any disclaimer, the term of this patent is extended or adjusted under 35 U.S.C. 154(b) by 0 days.

(21) Appl. No.: 10/472,324

(22) PCT Filed: Mar. 20, 2002

(86) PCT No.: PCT/JP02/02658

§ 371 (c)(1),
(2), (4) Date: Dec. 9, 2003

(87) PCT Pub. No.: WO02/075821

PCT Pub. Date: Sep. 26, 2002

(65) Prior Publication Data
US 2004/0113166 A1 Jun. 17, 2004

(30) Foreign Application Priority Data

Mar. 21, 2001 (JP) .............................. 2001-080806
Mar. 21, 2001 (JP) .............................. 2001-081447

(51) Int. Cl.
*H01L 29/22* (2006.01)
*H01L 29/24* (2006.01)
*H01L 29/227* (2006.01)

(52) U.S. Cl. .................... 257/98; 257/103; 438/22; 438/42

(58) Field of Classification Search ............... 257/98, 257/103; 438/22, 42
See application file for complete search history.

(56) References Cited

U.S. PATENT DOCUMENTS 5,727,015 A    3/1998   Takahashi et al.

(Continued)

FOREIGN PATENT DOCUMENTS

EP    1 005 068 A2    5/2000

(Continued)

*Primary Examiner*—Nathan J. Flynn
*Assistant Examiner*—Victor A. Mandala, Jr.
(74) *Attorney, Agent, or Firm*—Leydig, Voit & Mayer, Ltd.

(57) ABSTRACT

Concaves and convexes $1a$ are formed by processing the surface layer of a first layer 1, and second layer 2 having a different refractive index from the first layer is grown while burying the concaves and convexes (or first crystal 10 is grown as concaves and convexes on crystal layer S to be the base of the growth, and second crystal 20 is grown, which has a different refractive index from the first crystal). After forming these concavo-convex refractive index interfaces $1a$ ($10a$), an element structure, wherein semiconductor crystal layers containing a light-emitting layer A are laminated, is formed. As a result, the light in the lateral direction, which is generated in the light-emitting layer changes its direction by an influence of the concavo-convex refractive index interface and heads toward the outside. Particularly, when an ultraviolet light is to be emitted using InGaN as a material of a light-emitting layer, a quantum well structure is employed and all the layers between the quantum well structure and the low temperature buffer layer are formed of a GaN crystal, removing AlGaN. The quantum well structure preferably consists of a well layer made of InGaN and a barrier layer made of GaN, and the thickness of the barrier layer is preferably 6 nm–30 nm.

16 Claims, 9 Drawing Sheets

U.S. PATENT DOCUMENTS

| | | |
|---|---|---|
| 5,779,924 A | 7/1998 | Krames et al. |
| 6,091,083 A * | 7/2000 | Hata et al. .................... 257/79 |
| 6,091,085 A | 7/2000 | Lester |
| 6,316,785 B1 * | 11/2001 | Nunoue et al. ............... 257/14 |
| 6,617,182 B1 | 9/2003 | Ishida et al. |
| 6,720,586 B1 * | 4/2004 | Kidoguchi et al. ......... 257/103 |
| 6,940,098 B1 * | 9/2005 | Tadatomo et al. ............ 257/87 |
| 2001/0050376 A1 | 12/2001 | Shibata et al. |
| 2003/0085411 A1 | 5/2003 | Shibata et al. |
| 2004/0048471 A1 * | 3/2004 | Okagawa et al. ........... 438/689 |

FOREIGN PATENT DOCUMENTS

| | | |
|---|---|---|
| JP | 08-242034 A | 9/1996 |
| JP | 10-004209 A | 1/1998 |
| JP | 10-270754 A | 10/1998 |
| JP | 11-31864 A | 2/1999 |
| JP | 11-191659 A | 7/1999 |
| JP | 2000-021789 A | 1/2000 |
| JP | 2000-124500 A | 4/2000 |
| JP | 2000-156524 A | 6/2000 |
| JP | 2000-164929 A | 6/2000 |
| JP | 2000-331947 A | 11/2000 |
| JP | 2001-168387 A | 6/2001 |

* cited by examiner (a)

(b)

(a)

(b)

(c)

(a)

(b)

(c)

(a)

(b)

(c)

(a)

(b)

(c)

PRIOR ART

PRIOR ART

GAN GROUP SEMICONDUCTOR LIGHT-EMITTING ELEMENT WITH CONCAVE AND CONVEX STRUCTURES ON THE SUBSTRATE AND A PRODUCTION METHOD THEREOF

TECHNICAL FIELD

The present invention relates to a semiconductor light-emitting element (hereinafter to be also referred to simply as a light-emitting element). Particularly, this invention relates to a semiconductor light-emitting element having a light-emitting layer made of a GaN group semiconductor crystal (GaN group crystal).

BACKGROUND ART

The basic element structure of a light-emitting diode (LED) comprises a crystal substrate, and an n-type semiconductor layer, a light-emitting layer (including DH structure, MQW structure, SQW structure) and a p-type semiconductor layer sequentially grown thereon, wherein each of the n-type layer, the conductive crystal substrate (SiC substrate, GaN substrate and the like) and the p-type layer has an external outlet electrode.

For example, FIG. 8 shows one exemplary constitution of an element (GaN group LED) comprising a GaN group semiconductor as a material of a light-emitting layer, wherein a GaN group crystal layer (n-type GaN contact layer (also a clad layer) 102, a GaN group semiconductor light-emitting layer 103 and a p-type GaN contact layer (also a clad layer) 104) are sequentially laminated on a crystal substrate 101 by crystal growth, and a lower electrode (generally an n-type electrode) 105 and an upper electrode (generally a p-type electrode) 106 are set. In this specification, the layers are mounted on a crystal substrate (downside) and the light goes out upward, for the explanation's sake.

In LED, an important issue is how efficiently the light produced in the light-emitting layer can be externally taken out (what is called, light-extraction efficiency). Therefore, various designs have been conventionally tried such as an embodiment wherein an upper electrode 106 in FIG. 8 is rendered a transparent electrode so that the light heading upward from the light-emitting layer will not form an obstacle to the outside, an embodiment wherein the light heading downward from the light-emitting layer is returned upward by forming a reflective layer and the like.

For the light emitted from the light-emitting layer in the vertical direction, the light-extraction efficiency can be improved by making the electrode transparent or forming a reflective layer, as mentioned above. However, of the lights advancing in the spreading direction of the light-emitting layer (direction shown with a thick arrow in a light-emitting layer 103 in FIG. 8, hereinafter to be also referred to as a "lateral direction"), the light that reaches the sidewall within the total reflection angle defined by a refractive index differential can be externally emitted, but many other lights repeat reflection between, for example, sidewalls, are absorbed in an element, particularly by a light-emitting layer itself, attenuated and disappear. Such lights in the lateral direction are enclosed by upper and lower clad layers or a substrate (sapphire substrate) and an upper clad layer, or a substrate and an upper electrode (further, a coating substance on the outside of the element and the like), and propagated in the lateral direction. The light that propagates in the lateral direction occupies a large portion of the entire light amount produced by a light-emitting layer, and in some cases it amounts to 60% of the whole.

With regard to a flip-chip type LED (light goes out through a substrate) to be mounted with the substrate on the upper side, an embodiment is known wherein a side wall of a laminate, which is an element structure, has an angle and the side wall is used as a reflection surface toward the substrate side, so that such light in the lateral direction can be reflected in the substrate direction. However, cutting 4 facets of a small chip with an angle is a difficult processing, posing a problem in costs.

Furthermore, the light advancing in the vertical direction is also associated with problems in that a standing wave that repeats reflection between an interface of GaN group semiconductor layer/sapphire substrate and an interface of GaN group semiconductor layer/p-type electrode (or sealing material) is formed and the like, which in turn hinder light-extraction efficiency.

It is a first object of the present invention to provide a light-emitting element having a novel structure capable of solving the above-mentioned problem, directing the light in the lateral direction, which is produced in the light-emitting layer, to the outside, and further, suppressing the occurrence of the above-mentioned standing wave.

In addition to the problem of the light-extraction efficiency as mentioned above, the following problem of lower output is present when InGaN is used as a material of a light-emitting layer and the ultraviolet light is to be emitted.

A light-emitting element comprising InGaN as a light-emitting layer generally provides highly efficient emission. This is explained to be attributable to a smaller proportion of carriers captured by the non-radiative center, from among the carriers injected into the light-emitting layer, due to the localization of the carriers caused by fluctuation of the In composition, which in turn results in a highly efficient emission.

When a blue purple light—ultraviolet light having a wavelength of not more than 420 nm is to be emitted by a GaN group light-emitting diode (LED) and a GaN group semiconductor laser (LD), InGaN (In composition not more than 0.15) is generally used as a material of a light-emitting layer, and the structure involved in the emission is a single quantum well structure (what is called a DH structure is encompassed because of a thin active layer) or a multiple quantum well structure.

In general terms, the upper limit of the wavelength of the ultraviolet light is shorter than the end (380 nm–400 nm) of the short wavelength of visible light, and the lower limit is considered to be about 1 nm (0.2 nm–2 nm). In this specification, the blue purple light of not more than 420 nm emitted by the above-mentioned InGaN having an In composition of not more than 0.15 is also referred to as an ultraviolet light and a semiconductor light-emitting element emitting such ultraviolet light is referred to as an ultraviolet light-emitting element.

The ultraviolet light GaN can produce has a wavelength of 365 nm. Therefore, in the case of a ternary system wherein InGaN essentially contains In composition and free of Al composition, the lower limit of the wavelength of the ultraviolet light which can be generated is longer than the aforementioned 365 nm.

When compared to blue and green light-emitting elements having a light-emitting layer having a high In composition, the ultraviolet light-emitting element has a shorter wavelength. Thus, the In composition of the light-emitting layer needs to be reduced. As a consequence, the effect of the localization of the aforementioned fluctuation of the In composition decreases and the proportion thereof to be captured in the non-radiative recombination center increases, which prevents a high output. Under the circumstances, dislocation density, which causes the non-radiative recombination center, has been actively reduced. As a method for reducing the dislocation density, ELO method (lateral growth method) can be mentioned, and high output and long life have been achieved by reducing the dislocation density (see reference (Jpn. J. Appl. Phys. 39(2000) pp. L647) etc.).

In a GaN group light-emitting element, a light-emitting layer (well layer) is sandwiched between clad layers (barrier layers) made of a material having a greater band gap. According to a reference (Hiroo Yonezu, *Hikari Tsushin Soshi Kogaku*, Kougakutosho Ltd., p. 72), a guidance of setting the difference in the band gap to generally not less than "0.3 eV" has been provided.

From the above-mentioned background, when InGaN having a composition capable of emitting ultraviolet light is to be used as a light-emitting layer (well layer), the clad layer (a single quantum well structure contains not only a clad layer but also a barrier layer) used to sandwich the light-emitting layer is AlGaN having a greater band gap in view of enclosure of the carrier.

In addition, when a quantum well structure is to be constituted, the barrier layer needs to have a thickness of a level producing a tunnel effect, which is generally about 3–6 nm.

For example, FIG. 9 shows one embodiment of a conventional light-emitting diode using $In_{0.05}Ga_{0.95}N$ as a material of a light-emitting layer, which has an element structure wherein an n-type GaN contact layer 202, an n-type $Al_{0.1}Ga_{0.9}N$ clad layer 203, an $In_{0.05}Ga_{0.95}N$ well layer (light-emitting layer) 204, a p-type $Al_{0.2}Ga_{0.8}N$ clad layer 205 and a p-type GaN contact layer 206 are sequentially laminated on a crystal substrate S10 via a buffer layer 201, by crystal growth, and a lower electrode (generally an n-type electrode) P10 and an upper electrode (generally p-type electrode) P20 are formed.

However, the ELO method is problematic in that the methods for growing a GaN layer to be a base, forming a mask layer and re-growing are necessary, and growth in a number of times is necessary, thus increasing the number of steps. In addition, because a re-growth interface exists, it has a problem that, although dislocation density reduces, the output does not increase easily.

The present inventors have studied conventional element structures in an attempt to use InGaN as a material of the light-emitting layer and achieve higher output of ultraviolet light, and found that AlGaN layer is behind the distortion relative to the InGaN light-emitting layer, which results from the difference in the lattice constant.

It has been also found that, when a barrier layer is made thin in the quantum well structure, Mg is diffused from the p-type layer formed thereon to a light-emitting layer and forms a non-radiative center, thus problematically preventing high output of an ultraviolet light-emitting element.

A second object of the present invention is to achieve high output, and further, a long life, by optimizing the structure of the element, when InGaN is used as a material of a light-emitting layer of the light-emitting element of the present invention and ultraviolet light is to be emitted.

DISCLOSURE OF THE INVENTION

Accordingly, the present invention is characterized by the following.

(1) A semiconductor light-emitting element having an element structure comprising a first crystal layer processed to have concaves and convexes on its surface, a second crystal layer directly formed thereon or formed via a buffer layer, burying the concaves and convexes, the second crystal layer being made from a semiconductor material having a different refractive index from the aforementioned crystal layer, and a semiconductor crystal layer comprising a light-emitting layer laminated thereon.

(2) The semiconductor light-emitting element of the above-mentioned (1), wherein the second crystal layer and the semiconductor crystal layer thereon are made of a GaN group semiconductor crystal.

(3) The semiconductor light-emitting element of the above-mentioned (2), wherein the first crystal layer is a crystal substrate and the second crystal layer has grown while substantially forming a facet structure from the concaves and convexes processed on the surface of the crystal substrate.

(4) The semiconductor light-emitting element of the above-mentioned (3), wherein the concaves and convexes processed on the surface of the crystal substrate have a stripe pattern, and the longitudinal direction of the stripe is a <11-20> direction or a <1-100> direction of a GaN group semiconductor grown while burying them.

(5) The semiconductor light-emitting element of the above-mentioned (1) or (4), wherein the concaves and convexes have a cross sectional shape of a rectangular wave, a triangular wave or a sine curve.

(6) The semiconductor light-emitting element of the above-mentioned (1), wherein the difference between the refractive index of the first crystal layer and that of the second crystal layer at the wavelength of a light emitted from the light-emitting layer is not less than 0.05.

(7) The semiconductor light-emitting element of the above-mentioned (1), wherein the light-emitting layer is made of an InGaN crystal having a composition capable of generating an ultraviolet light.

(8) The semiconductor light-emitting element of the above-mentioned (1), wherein the light-emitting layer is a quantum well structure comprising a well layer made of InGaN and a barrier layer made of GaN.

(9) The semiconductor light-emitting element of the above-mentioned (1), wherein the first crystal layer is a crystal substrate, the second crystal layer is grown, via a low temperature buffer layer, on the concaves and convexes processed on the surface of the crystal substrate while burying the concaves and convexes, the light-emitting layer is a quantum well structure comprising a well layer made of InGaN and a barrier layer made of GaN, and all the layers between the quantum well structure and the low temperature buffer layer are made of a GaN crystal.

(10) The semiconductor light-emitting element of the above-mentioned (8) or (9), wherein the barrier layer has a thickness of 6 nm–30 nm.

(11) A semiconductor light-emitting element having an element structure comprising a crystal layer surface to be a base for crystal growth, a first GaN group semiconductor crystal grown on said surface to form concaves and convexes, a second GaN group semiconductor crystal having a different refractive index from the first GaN group semiconductor crystal, which is grown while covering at least a part of said concaves and convexes, a third GaN group semiconductor crystal grown until it flattens the above-mentioned concaves and convexes, and a semiconductor crystal layer having a light-emitting layer laminated thereon.

(12) The semiconductor light-emitting element of the above-mentioned (11), wherein the crystal layer surface to be a base for crystal growth has a structure or has been subjected to a surface treatment, which dimensionally limits a crystal growth area, and said limitation causes growth of the first GaN group semiconductor crystal into concaves and convexes, while forming substantial facet structure or a pseudo-facet structure.

(13) The semiconductor light-emitting element of the above-mentioned (12), wherein the structure or surface treatment limiting the crystal growth area is concaves and convexes processed on the crystal layer surface to be a base for crystal growth, or a mask pattern capable of causing a lateral growth, which is formed on the surface of the crystal layer to be a base for crystal growth, or a surface treatment capable of suppressing GaN group crystal growth, which is applied to a specific area of the surface of the crystal layer to be a base for crystal growth.

(14) The semiconductor light-emitting element of the above-mentioned (11), having an element structure wherein the second GaN group semiconductor crystal is grown covering, in a membrane, at least a convex part of the concaves and convexes made of the first GaN group semiconductor crystal, the third GaN group semiconductor crystal covering same is grown until it flattens the above-mentioned concaves and convexes, and the semiconductor crystal layer having the light-emitting layer is laminated thereon, and wherein the second GaN group semiconductor crystal has a multilayer membrane structure.

(15) The semiconductor light-emitting element of the above-mentioned (11), wherein the light-emitting layer is made of an InGaN crystal having a composition capable of generating an ultraviolet light.

(16) The semiconductor light-emitting element of the above-mentioned (11), wherein the light-emitting layer is a quantum well structure comprising a well layer made of InGaN and a barrier layer made of GaN.

(17) The semiconductor light-emitting element of the above-mentioned (16), wherein the barrier layer has a thickness of 6 nm–30 nm.

(18) The semiconductor light-emitting element of the above-mentioned (11), wherein the above-mentioned concaves and convexes have a stripe pattern, and the longitudinal direction of the stripe is a <11-20> direction or a <1-100> direction of the first GaN group semiconductor crystal.

In the following, the embodiment of the above-mentioned (1) is referred to as "embodiment (I)" and the embodiment of the above-mentioned (11) is referred to as "embodiment (II)" and explained.

DETAILED DESCRIPTION OF THE INVENTION

Since the problem of the present invention has the most important significance for a light-emitting element, the light-emitting element of the present invention is most preferably in the form of an LED. While the materials are not limited, an LED using a GaN group material. (GaN group LED), wherein the usefulness of the present invention becomes particularly remarkable as shown below, is taken as an example, and such light-emitting element is explained.

The light-emitting element enhances, in any embodiment, the light-extraction efficiency by the action and effect of a concavo-convex refractive index interface formed downward of the light-emitting layer. The light-emitting element can be further grouped into the above-mentioned embodiment (I) and embodiment (II) based on how this concavo-convex refractive index interface is formed.

In the above-mentioned embodiment (I), concaves and convexes are processed on a crystal substrate and buried with a semiconductor crystal (particularly GaN group crystal) to constitute a concavo-convex refractive index interface.

In the above-mentioned embodiment (II), a GaN group crystal is grown in the concaves and convexes, which are buried with a different GaN group crystal to constitute a concavo-convex refractive index interface.

Figure 1:
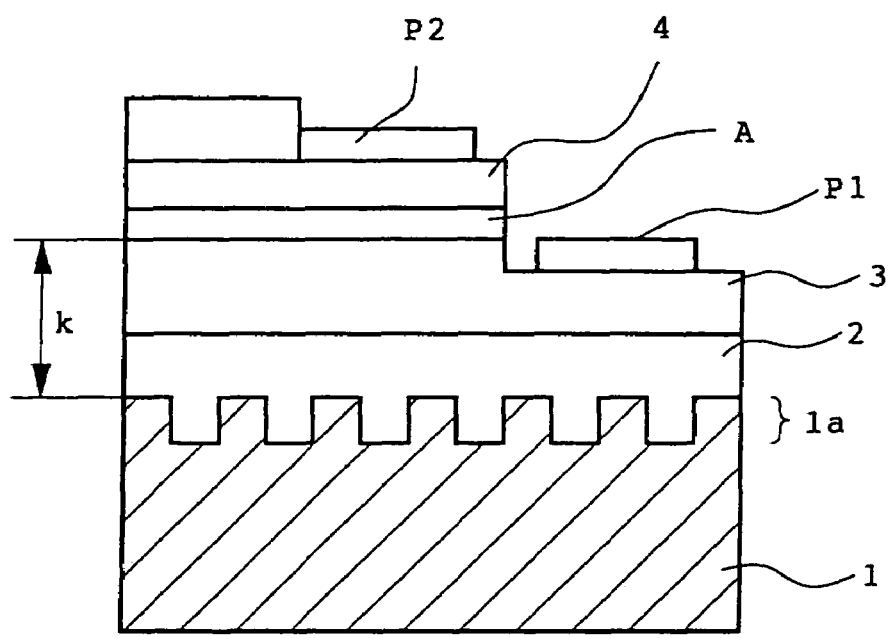
FIG. 1 is a schematic drawing showing an example of the structure of the light-emitting element of the present invention, wherein hatching is partially applied to show the boundary of areas (the same in the following Figures).
Figure 1:
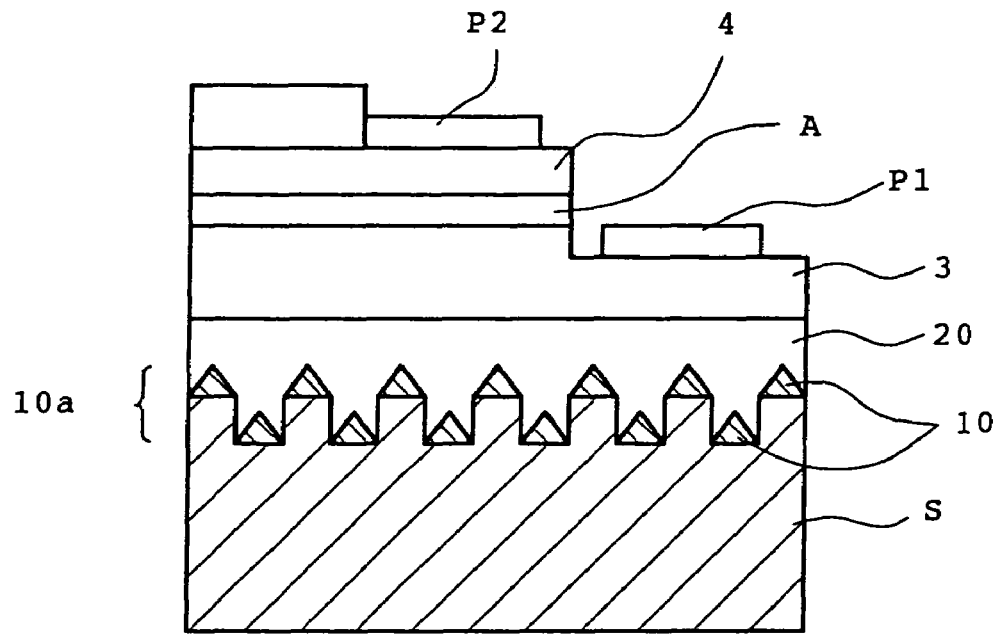

First, the above-mentioned embodiment (I) is explained. FIG. 1(a) shows a GaN group LED as an example of the structure of the light-emitting element of embodiment (I), wherein concaves and convexes 1a are processed on the surface of the first crystal layer (hereinafter to be also referred to as the "first layer") 1, and a second crystal layer (hereinafter to be also referred to as the "second layer") 2 made of a material having a refractive index different from that of the aforementioned crystal layer is grown directly or via a buffer layer, while burying the concaves and convexes. As a result, an interface having a different refractive index is formed in a concavo-convex form. Still thereon is laminated a semiconductor crystal layer (n-type contact layer 3, light-emitting layer A, p-type contact layer 4) by crystal growth, and electrodes P1 and P2 are formed to give an element structure. While the element structure in this Figure is a simple DH structure, an exclusive contact layer, an exclusive clad layer and the like may be formed, and the light-emitting layer may be an SQW structure or MQW structure, possibly having any structure as a light-emitting element.

Due to the above-mentioned constitution, the light produced in the light-emitting layer A, which propagates in the lateral direction, is influenced by a concavo-convex refractive index interface 1a, which causes a kind of mode conversion (change in the light direction to the direction of surface emission), and advances in a direction other than the lateral direction. As a result, the amount of the light heading toward the extraction surface increases, and the light absorption layer in the element decreases. As a result, the light-extraction efficiency is improved.

As stated in the description of the prior art, the light that advances in the direction other than toward the extraction outlet of the light (e.g., downward direction and lateral direction) has been conventionally made to head toward the outlet solely by simple reflection of the light by an end surface.

In contrast, in the present invention, a GaN group semiconductor layer region formed on a substrate by epitaxial growth is regarded [a waveguide that propagates light in the lateral direction], and along the waveguide, a concavo-convex refractive index interface is formed at a position capable of affecting the light directed to the lateral direction, thereby causing a kind of mode conversion (or diffused reflection) to direct the light toward a different direction.

The present invention takes note of the fact that the light propagating in the lateral direction propagates in the lateral direction as an electromagnetic wave having an electric field widely expanded to the upper and lower layers thereof, with the light-emitting layer as a center. The thickness of the light-emitting layer is approximately 10 nm–100 nm for the active layer of a typical DH structure. The light in the lateral direction propagates not only within such a thin active layer but also in the lateral direction as a wave having a wide distribution width reaching the crystal substrate. As shown in FIG. 1(a), therefore, when a concavo-convex refractive index interface 1a is formed within the light distribution in the lateral direction, the wave of the light in the lateral direction is influenced and a certain amount thereof can be directed to a different direction by a sort of mode conversion (or by producing a diffused reflection), which in turn increases the amount of light that goes outside. These concaves and convexes also function as a reflection surface that causes upwardly diffused reflection for the light emitted from the light-emitting layer toward the concaves and convexes per se.

Moreover, these concaves and convexes also function to lower the reflectance, in the perpendicular direction, of the interface of GaN group semiconductor layer/sapphire substrate. Thus, it is possible to suppress occurrence of a standing wave in the vertical direction, thereby to allow a large amount of light to enter the sapphire substrate, increase the amount of light to be extracted from the sapphire substrate, and enhance the light-extraction efficiency, particularly when extracting the light from the substrate side.

In embodiment (I), the concaves and convexes to be processed on the surface of a first layer are those formed by the surface itself of the first layer. They are different from the concaves and convexes formed when a mask layer made from $SiO_2$ and the like, used for the conventionally known lateral growth method, is applied to a flat surface.

In addition, the above-mentioned constitution makes it possible to preferably reduce the dislocation density of the GaN group crystal grown on a crystal substrate. By this constitution, dislocation density can be reduced by a one time growth without using a mask layer for ELO.

Namely, by the ELO method using a mask, a GaN film is grown on a base, once taken out from the growth apparatus to form a mask, then returned to a growth apparatus for re-growth. In contrast, by a growth method comprising formation of concaves and convexes on a crystal substrate, the growth does not need to be stopped once a crystal substrate after concave-convex processing is set in a growth apparatus. As a result, a re-growth interface is void and a crystal having fine crystallinity can be produced.

According to the above-mentioned constitution of the present invention, moreover, since a GaN group crystal layer is grown without using a mask, the problems of staining with impurities due to decomposition of the mask and degradation of crystal quality are obliterated.

These actions and effects afford a fine crystal having less dislocation, thus strikingly increasing the emission output. In addition, since the dislocation density that causes degradation reduces, a longer life can be obtained.

The whole location pattern of concaves and convexes may be any as long as it can exert an influence on the wave of light in the lateral direction, and may be a pattern wherein dot-like concave parts (or convex parts) are sequenced on the surface (standard plane) of the first layer, or a stripe like concavo-convex pattern wherein linear or curved concave grooves (or convex ridges) are sequenced at certain intervals. A pattern of convex ridges arranged in a lattice shape can be said to be an arrangement of angular concave parts. Of these, a stripe like concavo-convex pattern can exert a strong influence on the light in the lateral direction.

Figure 2:
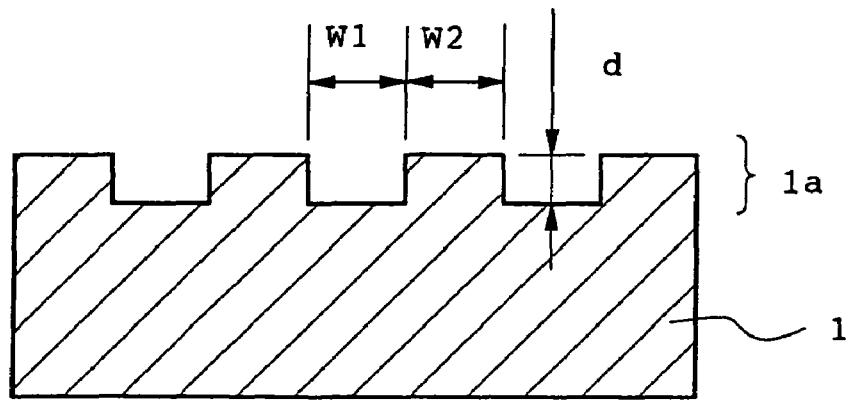
FIG. 2 is a schematic drawing showing one example of the crystal growth method for forming a concavo-convex refractive index interface in the embodiment (I) of the present invention.
Figure 2:
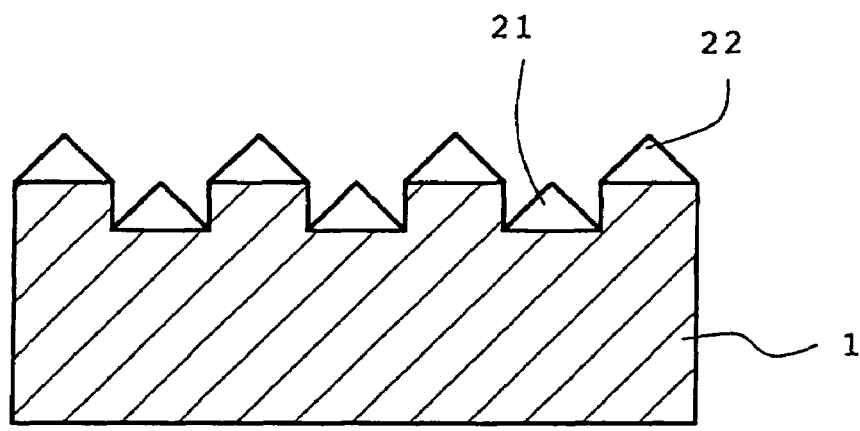
Figure 2:
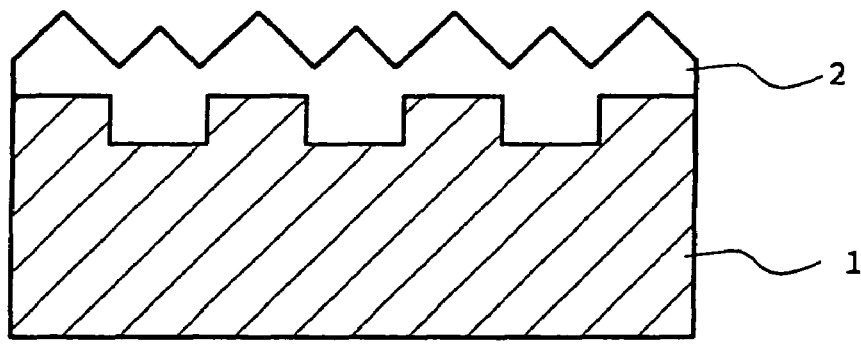
Figure 3:
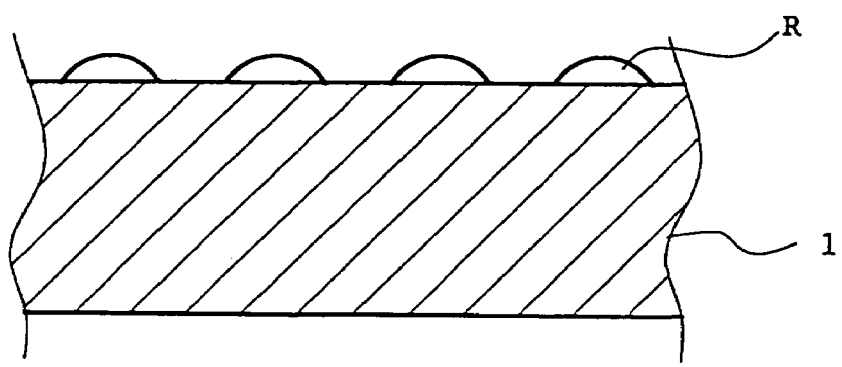
FIG. 3 is a schematic drawing showing a method of processing the surface of a crystal substrate to form concaves and convexes having a slant in the embodiment (I) of the present invention.
Figure 3:
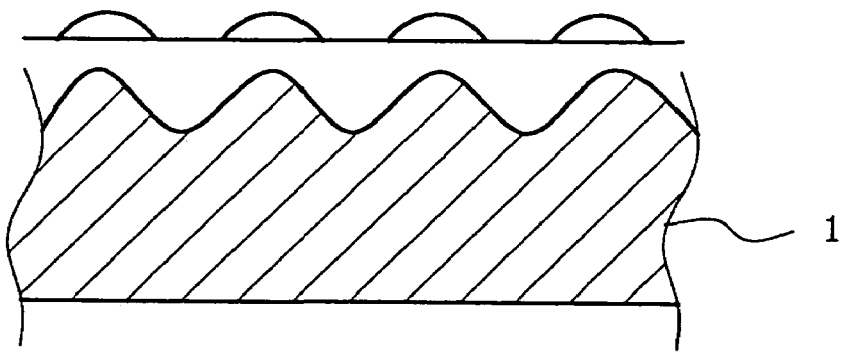
Figure 3:
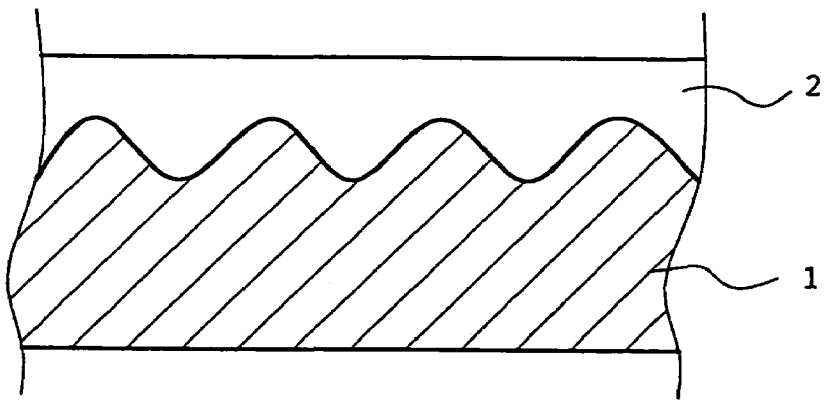

The cross sectional shape of the concaves and convexes may be a rectangular (including trapezoid) wave as shown in FIG. 2(a), a triangular wave and a sine curve as shown in FIG. 3(c), a combined wave of these and the like.

For the specification of the details of the concaves and convexes, the concavo-convex structure for crystal growth, which is formed for the reduction of dislocation density of the GaN group crystal to be mentioned later, may be referred to.

Furthermore, for the concaves and convexes to exert an influence on the light in the lateral direction, the concaves and convexes are preferably within a specific distance from the light-emitting layer. This distance is about 0.5 μm–20 μm, particularly preferably 1 μm–10 μm, shown by k in FIG. 1(a), and includes the distance between the upper surface of the substrate and the undersurface of the light-emitting layer in general LEDs. Thus, when an element structure is constructed by using a crystal substrate of the element as a first layer, forming concaves and convexes thereon, and growing a second layer to bury them, the concaves and convexes sufficiently exert an influence on the light in the lateral direction.

The materials of the light-emitting element may be conventionally known materials such as GaAs group, InP group, GaN group and the like. The usefulness of the present invention becomes highly remarkable in a GaN group light-emitting element (at least a material of a light-emitting layer being a GaN group semiconductor) having a major problem of reduction of dislocation density of crystal. In a GaN group light-emitting element, reduction of dislocation density of GaN group crystal is an essential assumption for forming an element. In the present invention, reduction of dislocation density of GaN group crystal is achieved by providing a growth method using a useful concavo-convex structure as in the following. Because the concavo-convex structure can serve both as the concaves and convexes of the above-mentioned refractive index interface, the usefulness of the concaves and convexes can be enhanced as compared to concaves and convexes formed only for the purpose of refractive index interface. In the following, a GaN group crystal growth method using such concavo-convex structure is explained.

The GaN group crystal growth method using a concavo-convex structure comprises, as shown in FIG. 2(a), processing concaves and convexes 1a on the surface of a crystal substrate (first layer) 1, and growing, as shown in FIG. 2(b), GaN group crystals 21, 22 from the concave parts and convex parts thereof while substantially forming a facet structure, whereby, as shown in FIG. 2(c), said concaves and convexes are substantially buried with the GaN group crystal, thus burying them without leaving concave parts as cavities. By the growth while substantially forming a facet structure is meant the growth of the type of facet structure growth to be mentioned later (e.g., growth while forming concaves and convexes in the thickness direction and the like). In the following, this growth method using concaves and convexes and burying the concave parts is referred to as "said facet growth method".

The said facet growth method to be used in the present invention is characterized in that a base surface where a facet plane can be formed is provided in advance from the early stage of the crystal growth, by processing concaves and convexes on the surface of a crystal substrate when a buffer layer etc. have not been formed yet.

By forming concaves and convexes on a crystal substrate, concave surfaces and convex surfaces divided by the difference in the levels of each other are used as a unit standard plane where facet structure growth is performed for vapor phase growth of a GaN group crystal on this plane. By using both concave surfaces and convex surfaces as planes capable of facet structure growth, as shown in FIG. 2(b), a crystal growth forming convexes from both the concave surfaces and convex surfaces occur in the early stage of the growth.

As a result, the dislocation line extending from the crystal substrate in the C-axis direction is bent by a facet plane (shown in FIG. 2(b), a slant plane of crystals 21, 22) into the lateral direction and does not propagate upward. Then as shown in FIG. 2(c), the growth is continued. When the growth plane is flattened, the vicinity of the surface becomes a low dislocation density region where propagation of dislocation from the substrate is reduced.

According to a general method for growing a GaN group crystal, a GaN membrane is grown on a sapphire C plane substrate via a low temperature buffer layer such as AlN and the like at a high temperature by MOVPE method and the like. When a high temperature GaN is grown on a low temperature buffer layer, a high temperature GaN crystal starts island-like growth with a part of the crystallized buffer layer as a growth nucleus, and a crystal having a high growth speed covers and joins a crystal having a slow growth speed, thereby promoting the growth in the lateral direction to form a flat GaN crystal in time. When concaves and convexes are not processed on a sapphire substrate, since the growth proceeds in such a manner that a C plane is produced, which is stable and has a lower growth speed, the plane is flattened. This is because the growth speed in the lateral direction is fast as compared to the growth speed of the stable C plane.

In contrast, by processing concaves and convexes on a substrate plane, a dimensional limitation on the crystal growth region works on the growth in the lateral direction. Therefore, for example, when the longitudinal direction of the concaves and convexes constitutes a stripe shape parallel to the <11-20> direction, a limitation is applied to the growth in the <1-100> direction. As a result, the growth rate in the C-axis direction increases and a slant facet having a slow crystal growth speed such as stable {1-101} and the like can be formed. In the present invention, by processing concaves and convexes on the growth-plane of a substrate, a dimensional limitation is applied on the above-mentioned growth region in the lateral direction.

In this specification, the crystal plane and crystal orientation to be indicated are all crystal plane and orientation of the GaN crystal grown on a crystal substrate.

By the concave part being substantially buried with the second layer means not only a completely buried state but any mode of burying as long as it affords an effective concavo-convex refractive index interface capable of achieving the object of the present invention. For example, a clearance may be formed at a part where a crystal grown from the concave part and a crystal grown from the convex part are joined, but it is convenient because changes in the refractive index can be achieved. Even when a clearance is formed on the concave part, too, it is acceptable as long as the undersurface of the second layer grown on the concave part enters the concave part to the extent that the object of the present invention can be achieved, and an effective concavo-convex refractive index interface is constituted.

Besides said facet growth method, for example, JP-A-2000-106455 discloses a method for growing a gallium nitride semiconductor, which comprises forming concaves and convexes on a crystal substrate and leaving the concave part as a cavity. However, because such growth method retains concave parts as cavity without filling, the refractive index interface when seen from the second layer (i.e., undersurface of the second layer) does not form sufficient concaves and convexes and the action and effect of mode modulation on the light in the lateral direction is small. Moreover, the presence of cavity is disadvantageous in releasing the heat generated in the light-emitting layer toward the substrate side. In addition, since propagation of the dislocation is not positively controlled, the dislocation is propagated in the upper part of the convex part, and a dislocation density reduction effect is insufficient.

The crystal substrate to be used in said facet growth method is a base substrate for the growth of various semiconductor crystal layers, and in the state prior to the formation of buffer layer etc. for lattice matching. As preferable crystal substrate, sapphire (C plane, A plane, R plane), SiC (6H, 4H, 3C), GaN, AlN, Si, spinel, ZnO, GaAs, NGO and the like can be used, but other materials may be used as long as the object of the invention can be achieved. The plane orientation of the substrate is not particularly limited and may be a just substrate or a substrate having an off-angle.

The GaN group semiconductor is a compound semiconductor represented by $In_xGa_yAl_zN$ ($0 \leq X \leq 1$, $0 \leq Y \leq 1$, $0 \leq Z \leq 1$, $X+Y+Z=1$). The crystal mixing ratio is optionally determined, and, for example, AlN, GaN, AlGaN, InGaN and the like can be mentioned as important compounds.

The concaves and convexes to be used for said facet growth method preferably have a concavo-convex shape that permits facet structure growth from both of the concave surface and convex surface, as mentioned above, and capable of acting on the light in the lateral direction, produced in the light-emitting layer. The preferable pattern formed by the concaves and convexes and the preferable mode of the concaves and convexes are explained in the following.

For the location pattern of concaves and convexes to be used in the facet growth method, a general reference may be made to the above-mentioned concaves and convexes capable of exerting an influence on the wave of the light in the lateral direction, and may be a pattern wherein dot-like concave parts (or convex parts) are sequenced, or a stripe like concavo-convex pattern wherein linear or curved concave grooves (or convex ridges) are sequenced at certain intervals. The cross sectional shape of the concaves and convexes may be a rectangular (inclusive of trapezoid) wave, triangular wave, sine curve and the like, and the pitch may not necessarily be the same, as mentioned above.

Of such various embodiments of concaves and convexes, a stripe like concavo-convex pattern wherein linear or curved concave grooves (or convex ridges) are sequenced at certain intervals is preferable because it can simplify the production step thereof, the pattern can be made easily, and as mentioned above, an influence on the light in the lateral direction is significant.

When the pattern of the concaves and convexes is a stripe, the longitudinal direction of the stripe may be optional. When it is set to be the <11-20> direction for the GaN group crystal grown while burying the concaves and convexes, a slant facet of the {1-110} plane and the like are tend to be easily formed when a dimensional limitation is applied on the growth in the lateral direction. As a result, the dislocation propagated in the C-axis direction from the substrate side is bent by this facet plane into the lateral direction, propagation to the upward becomes difficult and a low dislocation density region can be formed, which is particularly preferable.

In contrast, when the longitudinal direction of the stripe is set to the <1-100> direction, the effect as mentioned above can be achieved by determining the growth conditions that permit easy formation of a pseudo-facet plane.

Said facet growth method and preferable size of the concaves and convexes capable of effectively influencing the direction of the light in the lateral direction are shown in the following taking concaves and convexes having a cross section of rectangular wave as shown in FIG. 2(a).

The width W1 of the concave groove is preferably 0.5 μm–20 μm, particularly 1 μm–10 μm.

The width W2 of the convex part is preferably 0.5 μm–20 μm, particularly 1 μm–10 μm.

The amplitude of concaves and convexes (depth of concave groove) d is 0.05 μm–5 μm, particularly preferably 0.2 μm–3 μm.

These sizes and the pitch etc. calculated therefrom are the same as those of the concaves and convexes having different cross sectional shape.

While how a facet plane is grown on a GaN group crystal varies depending on the combination of the width of a concave part and the width of a convex part, this facet plane suffices for use as long as it can bent the propagation of dislocation preferable embodiment is as shown in FIG. 2(b), wherein each crystal unit 21, 22 grown from the unit standard plane form a mountain shape with both facet planes crossing at the top without forming a flat part on each top (long ridges in the shape of triangle or a mountain range). With such facet plane, almost all the dislocation lines continued from the aforementioned base plane can be bent and the dislocation density immediately above can be further reduced.

Note that not only by the combination of the widths of concaves and convexes but also by changing the depth of the concave part (height of convex part) d, the facet plane forming area can be controlled.

As the processing method of concaves and convexes, for example, a method comprising patterning according to the embodiment of the objective concaves and convexes by general photolithographic techniques, and etching processing by RIE technique and the like to give the objective concaves and convexes, and the like can be mentioned.

The method for growing a semiconductor crystal layer on a substrate is preferably HVPE, MOVPE, MBE method and the like. When a thick film is to be prepared, HVPE method is preferable and a thin film is to be prepared, MOVPE method and MBE method are preferable.

The formation of a facet plane can be controlled by the growth conditions (kind of gas, growth pressure, growth temperature and the like) for crystal growth. By growth under reduced pressure with lower $NH_3$ partial pressure, a {1-101} plane facet is easily formed and facet planes can be easily formed by normal pressure growth as compared to growth under reduced pressure.

When the growth temperature is raised, the growth in the lateral direction is promoted. By low temperature growth, the growth in the C-axis direction becomes faster than that in the lateral direction and a facet plane is easily formed.

The above indicates that control of a facet shape is available depending on the growth conditions. As long as the effect of the present invention is achieved, the conditions can be determined according to the object.

In said facet growth method, when a GaN group crystal is to be grown from the concaves and convexes formed on a crystal substrate, it may be directly grown on the crystal substrate, or may be grown via a known low temperature buffer layer such as GaN, AlN and the like, or other known buffer layer.

While the above shows a method of burying concaves and convexes by said facet growth method, concaves and convexes may be buried by general growth (e.g., growth for greater growth in the lateral direction) without focusing on a facet structure growth, by selecting the size and crystal growth conditions of the concaves and convexes.

The next exemplifies an embodiment wherein the cross section of concaves and convexes is a triangular wave. This embodiment is particularly useful when a GaN crystal substrate is used as a first layer.

As a method for processing the surface of a crystal substrate into concaves and convexes having such inclination, for example, a method comprising forming a resist R having a cross sectional shape of a convex arch with thinner both edges in an object pattern of a stripe, a lattice and the like, on the surface of a GaN substrate 1, and applying the gas etching, as shown in FIG. 3(a), can be mentioned. As a material of the resist, one capable of the gas etching is preferably used. By applying the gas etching to a GaN substrate with a resist R, the exposed area of the GaN substrate can be eroded from the first, and the thin shoulder of the resist is ablated as the etching proceeds, and the etching of the GaN crystal begins belatedly. Because the starting time of the etching is postponed in this way, concaves and convexes ultimately have a near triangular wave cross section as a whole, as shown in FIG. 3(b). The thickest part of the resist may be removed by said gas etching but may be retained. In this case, a remover exclusive for the resist, which is free of damage to the GaN crystal, may be used to remove this part. In addition, an etching treatment of the convex part is more effectively conducted finally.

Preferable sizes of the concaves and convexes having inclination as shown in FIG. 3(b) are as follows.

The pitch of the concaves and convexes is 2 μm–40 μm, particularly preferably 2 μm–20 μm.

The amplitude of the concaves and convexes is 0.05 μm–5 μm, particularly preferably 0.2 μm–3 μm.

The arrangement pattern of the concaves and convexes having an inclination is, as in said facet growth method explained in the above, a pattern wherein dot-like concave parts (or convex parts) are sequenced, or a stripe like concavo-convex pattern wherein linear or curved concave grooves (or convex ridges) are sequenced at certain intervals. A stripe concavo-convex pattern is particularly preferable.

As shown in FIG. 3(c), the growth of the second layer 2 is started from the entire surface of the concaves and convexes, and the growth is continued until the concaves and convexes are completely buried. Since the side wall of the concave groove is a pseudo-facet plane at this point, the action and effect is achieved that a dislocation line is bent with said facet plane as an interface when a GaN group crystal is grown, and a part with a low dislocation density can be formed in the upper layer. In addition, such concaves and convexes not only act on the light in the lateral direction but also act as a reflection surface, which is a preferable embodiment.

While the etching method is not limited, gas etching by RIE (Reactive Ion Etching) and the like using an etching gas including chlorine is preferable because it does not damage a crystal surface when the first layer is a GaN crystal substrate.

In the above description, the concavo-convex structure of said facet growth method is also used as concaves and convexes for the light in the lateral direction in a GaN group light-emitting element. However, such concurrent use is not essential and concaves and convexes only for the light in the lateral direction may be separately formed.

Now the above-mentioned embodiment (II) is explained. FIG. 1(b) shows a GaN group LED as an example of the structure of the light-emitting element by the above-mentioned embodiment (II), wherein a first GaN group crystal (hereinafter to be also referred to as "first crystal") 10 is grown on a surface of the crystal layer (crystal substrate in this Figure) S to be the base of the crystal growth, while forming concaves and convexes with a facet structure, a second GaN group crystal (hereinafter to be also referred to as a "second crystal") 20, having a different refractive index from the first GaN group crystal, is grown covering, from among said concaves and convexes, at least convex parts (first crystal 10 itself in the embodiment of FIG. 4), thereby constituting a concavo-convex refractive index interface 10a and the same action and effect as in the above-mentioned embodiment (I) can be achieved.

In this embodiment (II), it is important that the composition is changed to a different GaN group crystal when the first crystal is grown to form concaves and convexes, thereby changing the refractive index, namely, not to allow growth of the first crystal to the point it flattens. The changes in the refractive index (changes in composition) may be step-like changes or continuous changes as shown in the distribution refractive index waveguide.

The method of growing the first crystal into concaves and convexes is not limited. By the growth while substantially forming a facet structure, or while forming a pseudo-facet structure, the concaves and convexes can be grown, which preferably achieves the object of the present invention.

Figure 5:
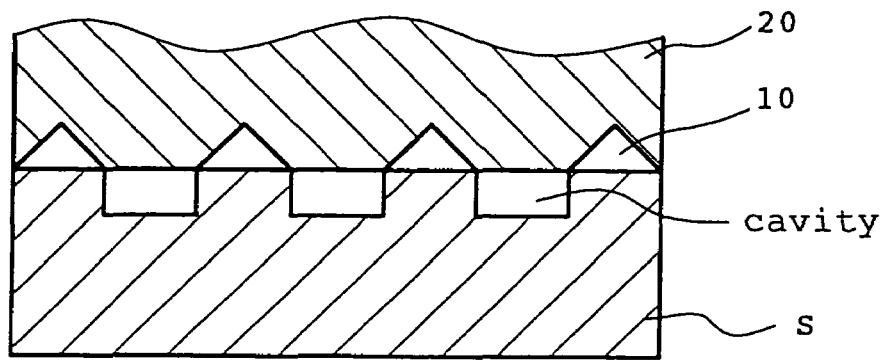
FIG. 5 is a schematic drawing showing another example of the crystal growth method for forming a concavo-convex refractive index interface in the embodiment (II) of the present invention.
Figure 5:
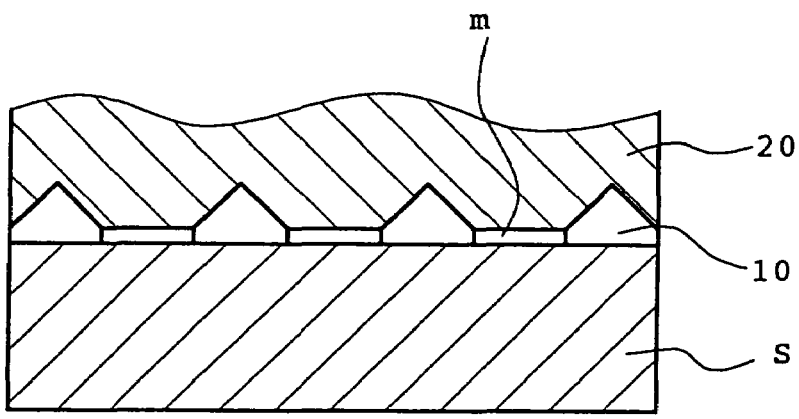
Figure 5:
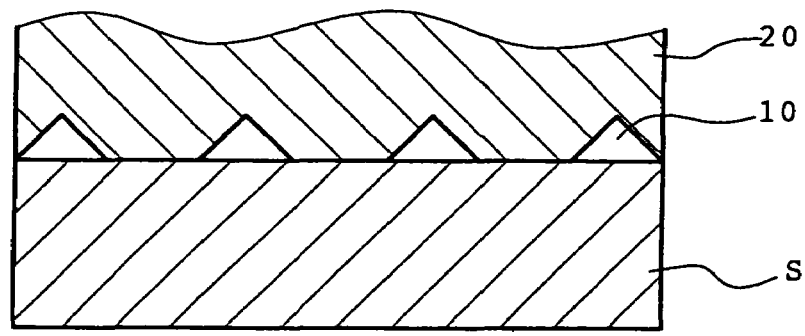

The concaves and convexes as used herein are not only those wherein convex parts are successively adjoined to form a wave, but also those wherein convex-like first crystals 10 are disposed dispersingly and a different substance is positioned as a concave part between them, as shown in FIG. 5(a)–(c).

The shape of the concaves and convexes formed by the facet growth of the first crystal is not limited, and, for example, may be a trapezoid having a flat part on the top of the convex part. To achieve sufficient action and effect of the concavo-convex refractive index interface, as explained in the above-mentioned embodiment (I), an embodiment wherein a crystal unit grown from each unit standard plane forms a mountain shape with both facet planes crossing at the top without forming a flat part on each top (long ridges in the shape of triangle or a mountain range) is preferable.

In embodiment (II), any method can be used as long as it can form concaves and convexes with the first crystal, and when the first crystal forms concaves and convexes, a second crystal is grown to cover them, thereby constituting a concavo-convex refractive index interface.

A method of growing a GaN group crystal in concaves and convexes is particularly preferably a method for achieving facet growth (or growth analogous thereto). For this end, a method dimensionally limiting the crystal growth region to the crystal layer surface to be a base for crystal growth can be mentioned.

For example, (1) a method of processing concaves and convexes on the crystal layer surface to be a base for crystal growth as the said facet growth method explained in detail above (FIG. 1(b), FIG. 4, FIG. 5(a), FIG. 6, FIG. 7), (2) a method wherein a mask pattern that prevents growth of a GaN group crystal is formed in a specific region of the crystal layer surface to be a base for crystal growth (FIG. 5(b)), (3) a method wherein a surface treatment for suppressing GaN group crystal growth is applied to a specific region of the crystal layer surface to be a base for crystal growth (FIG. 5(c)) and the like can be mentioned.

By these methods, the first crystal is grown to form concaves and convexes.

Figure 4:
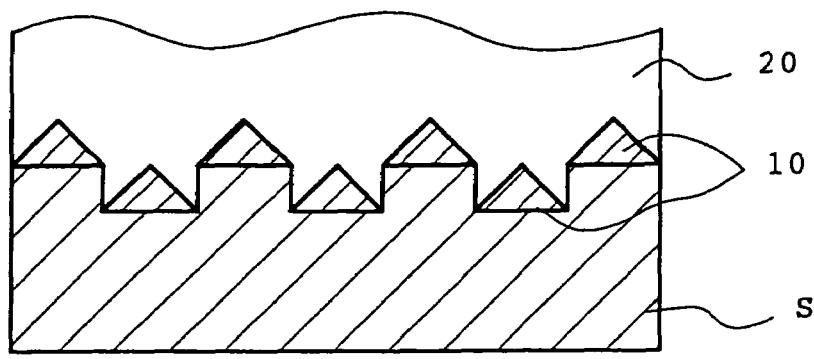
FIG. 4 is a schematic drawing showing one example of the crystal growth method for forming a concavo-convex refractive index interface in the embodiment (II) of the present invention.
Figure 4:
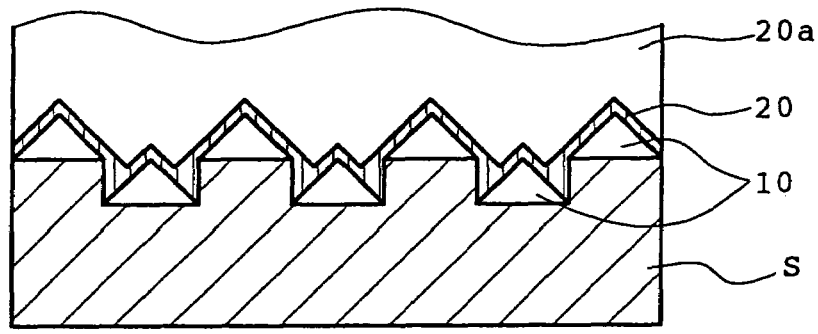
Figure 4:
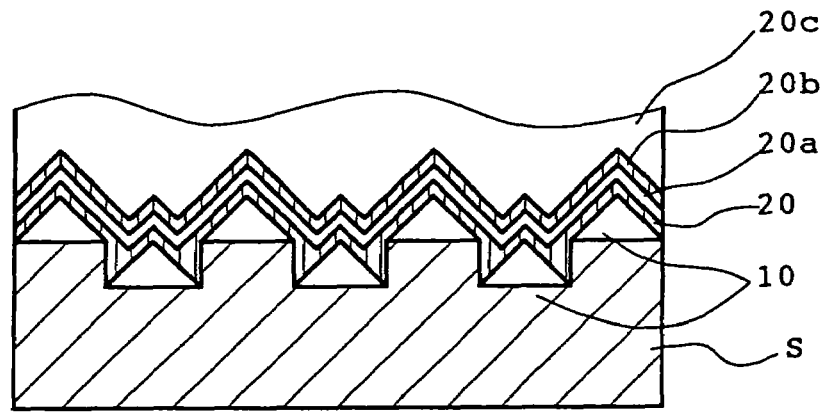
Figure 7:
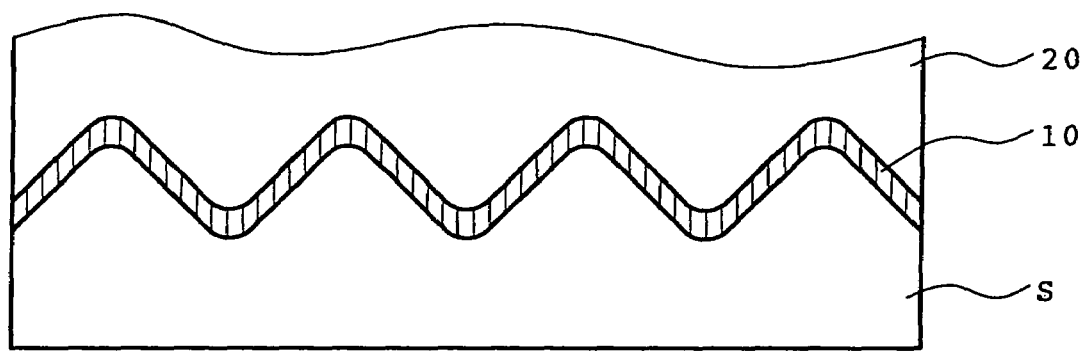
FIG. 7 is a schematic drawing showing another example of the crystal growth method for forming a concavo-convex refractive index interface in the embodiment (II) of the resent invention.
Figure 8:
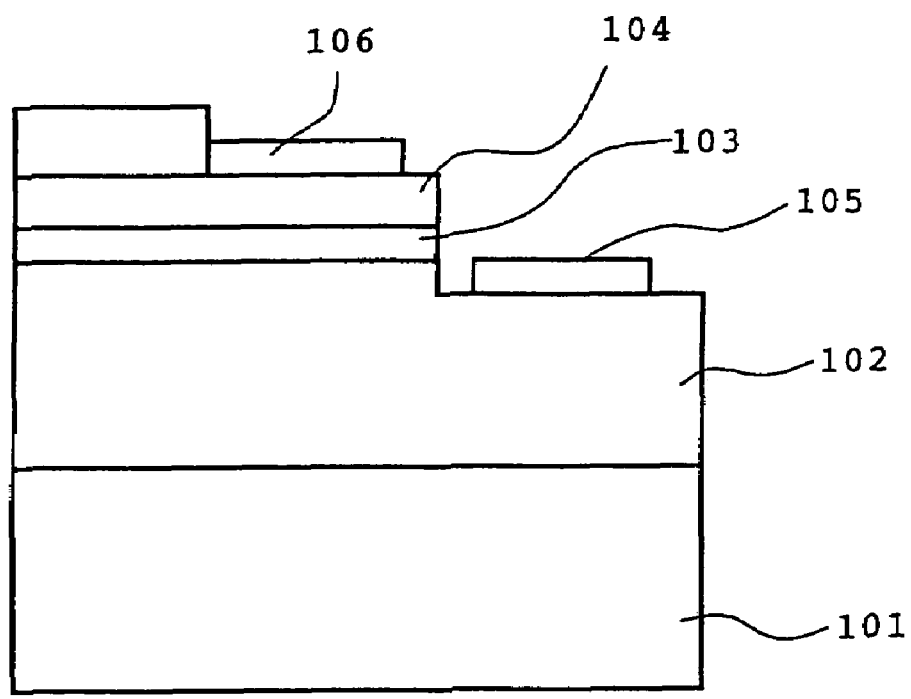
FIG. 8 is a schematic drawing showing the structure of a conventional GaN group light-emitting element.
Figure 9:
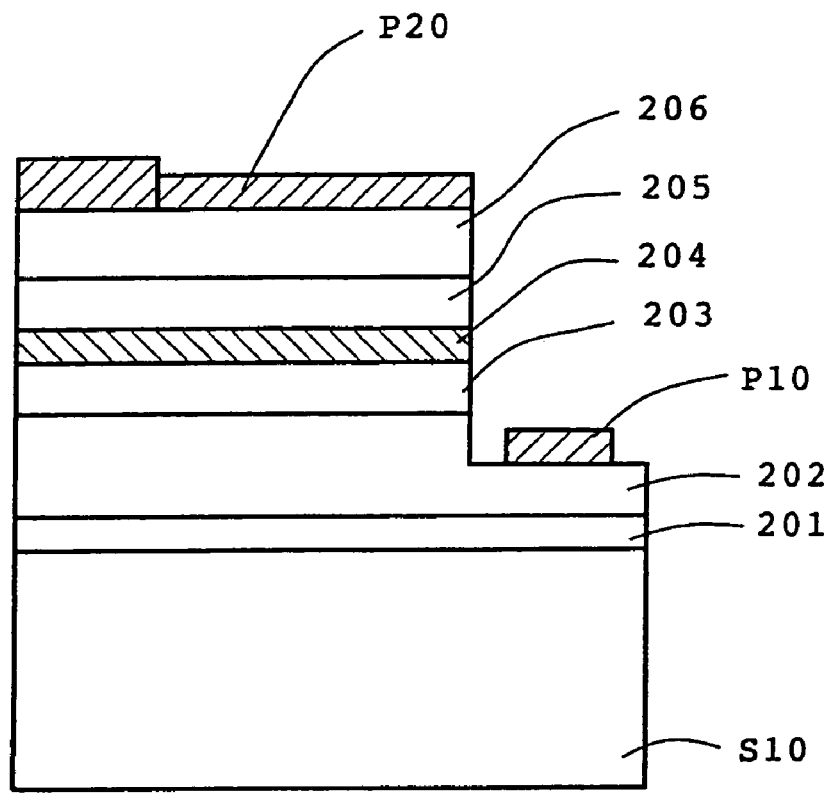
FIG. 9 is a schematic drawing showing one example of a conventional light-emitting diode using $In_{0.05}Ga_{0.95}N$ as a material of a light-emitting layer.

As a method of the above-mentioned (1), not only an embodiment wherein the concave part of the concaves and convexes is substantially buried with GaN group crystals 10, 20 based on said facet growth method, as shown in FIG. 4, but also an embodiment as shown in FIG. 5(a), wherein a first crystal 10 is facet grown exclusively from the upper part of the convex part, then a second crystal 20 is employed to be laterally grown on the concave part, leaving the concave part as a cavity may be employed. It is possible to utilize concaves and convexes having an inclination explained as an embodiment of FIG. 3, in the above-mentioned embodiment (I). This is an embodiment wherein, as shown in FIG. 7, a first crystal 10 is grown on concaves and convexes having an inclination on a crystal substrate S to perform a pseudo-facet growth, and then changed to a second crystal 20.

As a method of the above-mentioned (2), various lateral growth methods using a conventionally known mask are all applicable, as shown in FIG. 5(b).

As a material of the mask m, a known mask material may be used, such as nitrides and oxides of Si, Ti, Ta, Zr and the like, namely, $SiO_2$, $SiN_x$, $TiO_2$, $ZrO_2$ etc. As a mask pattern, a known pattern may be referred to but mainly, a stripe pattern, a lattice pattern and the like are important, and the direction of the boundary between the mask region and the non-mask region is particularly important. When the boundary between the mask region and the non-mask region is to be the straight line extending in the <1-100> direction of the GaN group crystal to be grown, the growth in the lateral direction becomes faster. Conversely, when the boundary between the mask region and the non-mask region is to be the <11-20> direction, a slant facet such as {1-101} plane and the like is easily formed, which is preferable facet growth for the present invention.

For a specific size of a mask, an atmospheric gas ($H_2$, $N_2$, Ar, He etc.), crystal growth method (HVPE, MOVPE) and the like for performing a lateral growth method using a mask, known techniques may be referred to, and, for example, the detail is described in references (A. Sakai et al., Appl. Phys. Lett. 71(1997) 2259.).

As the method of the above-mentioned (3), for example, a method described in JP-A-2000-277435, which uses an $SiO_2$ residue as a mask can be mentioned. By this method, the action and effect similar to those in the above-mentioned mask can be achieved and a GaN group crystal 10 can be facet grown in a convex shape from an area free of the treatment.

As the combination (first crystal/second crystal) of a first crystal to be grown in a convex shape and a second crystal covering same in the above-mentioned embodiment (II), (AlGaN/GaN), (AlInGaN/GaN) and the like can be mentioned. By the presence as a first crystal of AlGaN downside of GaN, a second crystal GaN corresponds to a core having a high refractive index as referred to in the optical waveguide, the first crystal AlGaN corresponds to a clad having a lower refractive index than the above, enhancing the action and effect of the present invention, and effectively acts as a reflective layer. The GaN group crystal (e.g., GaN) that buries concaves and convexes may be undoped or of an n-type.

While (1) to (3) above are various methods to facet grow a GaN group crystal, a third GaN group crystal to flatten concaves and convexes in any method may be a second crystal (embodiment wherein second crystals is successively grown until it flattens), or a crystal (including first crystal) different from a second crystal. In addition, the third GaN group crystal may be varied to comprise multi layers.

There exists a common variation to change the composition of the GaN group crystal to a multi-layered one during or after the growth of the facet structure by the selection of the mode of the third GaN group crystal. Such variation is explained in the following taking the formation of concaves and convexes by said facet growth method of the above-mentioned (1) as an example.

In the embodiment of FIG. 4(*a*), the second crystal 20 that covers the first crystal 10 continues to grow until it flattens the concaves and convexes. In this variation, the second crystal (e.g., AlGaN) 20 covering the first crystal (e.g., GaN) 10 is a membrane and grows until a GaN group crystal (e.g., GaN) 20*a* having a different refractive index is flattened, as shown in FIG. 4(*b*). Further, in the embodiment of FIG. 4(*c*), a second crystal 20 grows as a membrane covering the first crystal 10 and a first crystal 20*a* and a second crystal 20*b* sequentially cover the second crystal 20, thus forming a multilayer structure of GaN group crystal membranes having different refractive indices, and grows until a GaN group crystal 20*c* is flattened, as shown in FIG. 4(*c*).

By an embodiment of a multilayer structure consisting of GaN group crystal membranes having different refractive indices, reflecting property can be further improved. For example, a Bragg reflective layer may be formed by optimally designing the membrane thickness relative to the emission wavelength and affording an ultra lattice structure by a pair of AlGaN/GaN and the like.

When a multilayer structure is to be formed, the number of layers of the membrane is not limited and, as shown in FIG. 4(*b*), it may be a structure sandwiching one layer of membrane, a structure comprising multi-layers (5 pairs–100 pairs) as shown in FIG. 4(*c*), and the like.

Figure 6:
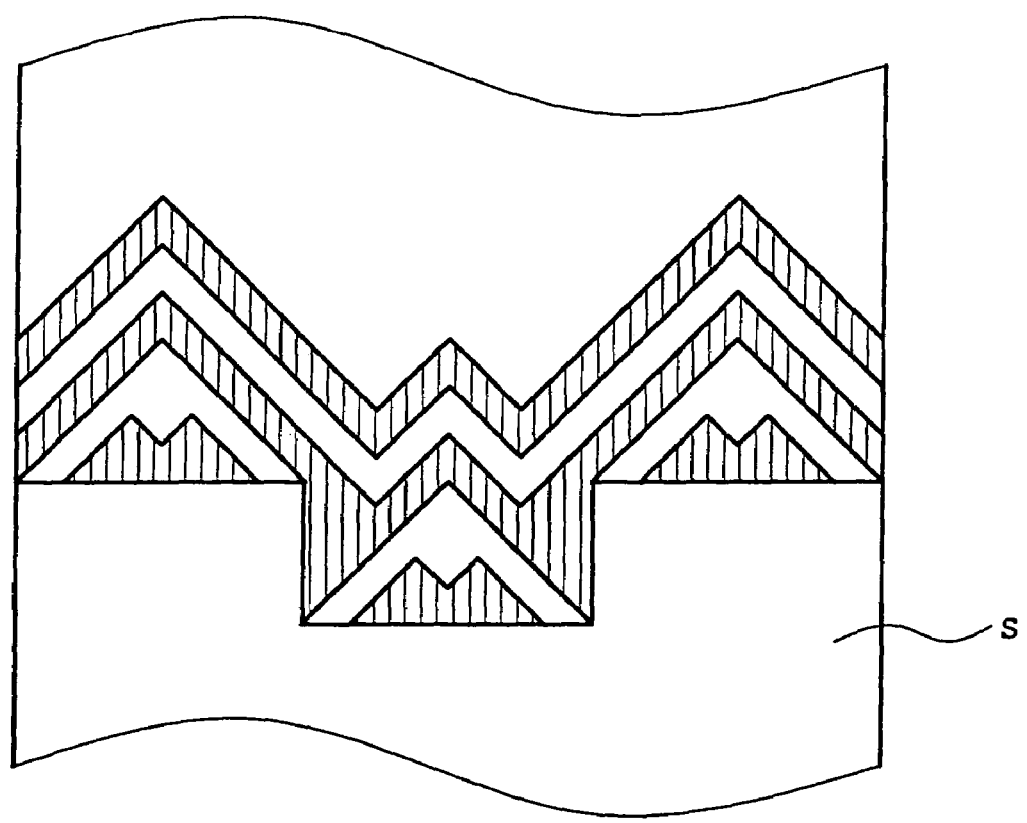
FIG. 6 is a schematic drawing showing a variation of the crystal growth methods shown in FIGS. 4 and 5.

When to change the first crystal grown (particularly preferably facet grown) on the concaves and convexes to a second crystal is not limited, and the composition may be changed from the initial growth stage of growth on the concaves and convexes formed on the substrate S, as, for example, schematically shown in FIG. 6 which shows the growth state of the multi-layer concaves and convexes made of a GaN group crystal. In this Figure, hatching is applied to distinctively show that a GaN group crystal having a different refractive index grows in a multi-layer state to form concaves and convexes.

In embodiment (II), a concavo-convex refractive index interface preferably have a height of the convex part of 0.05 μm–10 μm, particularly 0.1 μm–5 μm, to preferably achieve the object of the present invention. In addition, the pitch of the concavo-convex refractive index interface is generally 1 μm–10 μm, particularly preferably 1 μm–5 μm, by a conventionally known lateral growth method. The pitch of the concaves and convexes obtained by said facet growth method is the same as that in the above-mentioned embodiment (I).

In either the above-mentioned embodiment (I) or (II), the difference between the refractive index of the first layer (first crystal) and that of the second layer (second crystal) is preferably not less than 0.01, particularly not less than 0.05, at the wavelength of the light emitted from the light-emitting layer.

The relationship between various refractive indices of the both is preferably first layer (first crystal)<second layer (second crystal), whereby the second layer (second crystal) corresponds to the core of the high refractive index as referred to in the optical waveguide, the first layer (first crystal) corresponds to the clad having a lower refractive index, and the action and effect of the present invention can be enhanced further.

The next shown is a preferable embodiment using InGaN as a material of a light-emitting layer and the ultraviolet light (wavelength 420 nm or below) is output. The InGaN in this case has an In composition of not more than 0.15.

In both the above-mentioned embodiments (I) and (II), a fine crystal having less dislocation due to concaves and convexes can be formed, which in turn strikingly increases the emission output. In addition, the dislocation density that causes degradation is reduced and a long life can be achieved.

A preferable embodiment when the ultraviolet light is output is the above-mentioned embodiment (I) wherein the material of the GaN group crystal layer to be formed on the concaves and convexes of the substrate is limited to a GaN crystal. An MQW structure comprising an InGaN crystal layer having a composition permitting generation of ultraviolet light as a well layer is constituted on this GaN crystal layer and used as a light-emitting layer. In other words, this is a constitution wherein the n-type clad layer consists of GaN and an AlGaN layer does not exist between the light-emitting layer and the low temperature buffer layer.

In this embodiment, an InGaN having a composition permitting generation of ultraviolet light is used as a light-emitting layer, whereas as a material of an n-type clad layer, AlGaN, which is conventionally considered to be essential, is not used but GaN is used. In the present invention, it has been found with regard to the ultraviolet light-emitting layer, that even if an n-type clad layer is GaN, positive holes can be sufficiently confined. This is considered to be attributable to the fact that, since the effective mass of the positive hole injected from the p-type layer is large, it has a short diffusion length and cannot sufficiently reach the n-type clad layer. In the constitution of the present invention, therefore, the n-type GaN layer that is present as a lower layer of the InGaN light-emitting layer does not correspond to the conventional clad layer in a strict sense. By removing the AlGaN present as a clad layer between the crystal substrate and the light-emitting layer and employing a GaN layer, the distortion of the InGaN light-emitting layer can be reduced.

When distortion is applied to the light-emitting layer (well layer), a piezo-electric field is generated due to the distortion, which causes tilting of the well structure, thereby reducing the overlap in wave function of electron and hole. As a result, recombination probability of electron and hole decreases and the emission output is weakened. To avoid this, an attempt has been made to dope Si in the MQW structure thereby to cancel the piezo-electric field. However, since crystallinity is degraded due to the doping, this is not a preferable method. By removing an n-type AlGaN layer, as mentioned above, such possibility is obliterated and high output can be achieved.

Combined with the reduction of the dislocation density using concaves and convexes of a substrate explained above and the above-mentioned action and effect by removing AlGaN, dislocation density of the InGaN light-emitting layer is reduced, as well as the distortion is reduced, which in turn sufficiently improves emission output and the life of an element.

In another preferable embodiment for output of ultraviolet light, the material of the barrier layer of a quantum well structure of the light-emitting layer is limited to GaN. As a result, an AlGaN layer between a well layer and a low temperature buffer layer is removed, distortion of a well layer is suppressed and high output and long life can be achieved. In a conventional quantum well structure, AlGaN is used as a barrier layer and a clad layer in consideration of the confinement of carrier in a well layer.

However, these combinations have the following problems caused by highly different optimal values of crystal growth conditions for AlGaN and InGaN. AlN has a high melting point as compared to GaN, and InN has a low melting point as compared to GaN. Therefore, the optimal growth temperature is 1000° C. or below, preferably about 600–800° C., for InGaN, when GaN is 1000° C., and for AlGaN, the temperature is not less than that for GaN. When AlGaN is used for a barrier layer, the optimal crystal growth conditions cannot be achieved unless the growth temperatures of AlGaN barrier layer and InGaN well layer are changed, thereby problematically lowering the crystal quality. To change the growth temperature means discontinued growth, and in a well layer which is a thin membrane having a thickness of about 3 nm, problems occur in that the thickness changes due to an etching action during the discontinuance in the growth, crystal defect occurs in the surface and the like. Due to the presence of such a trade-off relationship, it is difficult to obtain a high quality product by the combination of an AlGaN barrier layer and an InGaN well layer. Moreover, when AlGaN is used for the barrier layer, a distortion is imposed on the well layer, which problematically prevents high output. Thus, in the present invention, GaN was used as a material of the barrier layer in an attempt to reduce the above-mentioned trade-off problem, whereby the crystal quality was improved. With the aim of reducing the distortion, GaN was used as an n-type clad layer, and the reduced distortion afforded high output. When GaN was used for a clad layer, insufficient confinement of carrier from InGaN having a composition capable of ultraviolet light emission was worried, but it was found that the carrier (particularly hole) could be confined.

In a different preferable embodiment for the output of ultraviolet light, the thickness of the barrier layer in the MQW structure is limited to 6 nm–30 nm, preferably 8 nm–30 nm, particularly preferably 9 nm–15 nm. The thickness of the barrier layer in a conventionally MQW structure is 3 nm–7 nm.

When the barrier layer is made as thick as this, the wave functions do not overlap at all, and it is more like SQW structures laminated in multi layers, rather than a MQW structure, but sufficient high output can be achieved. When the barrier layer exceeds 30 nm, the hole injected from the p-type layer is trapped by a dislocation defect to be a non-radiative center, which is present in the GaN barrier layer, and the like before the hole reaches the well layer, and the emission efficiency is unpreferably reduced.

The action and effect can be achieved that the well layer does not easily suffer from the heat during growth of the layers above and damage by gas, because the barrier layer is thickened, thus reducing damages, and diffusion of dopant materials (Mg and the like) from the p-type layer to the well layer is reduced, and further, the distortion imposed on the ell layer is also reduced.

EXAMPLES

Examples of actual preparation of GaN group LEDs having concavo-convex refractive index interface according to the above-mentioned embodiments (I) and (II) are shown in the following.

Example 1

In this Example, concaves and convexes of a sapphire substrate were buried by said facet growth method according to the above-mentioned embodiment (I) to give a concavo-convex refractive index interface and a GaN group LED was actually prepared as shown in FIG. 1(a).

A stripe pattern (width 2 µm, period 4 µm, stripe orientation: the longitudinal direction of the stripe is <11-20> direction for GaN group crystal grown on the substrate) was formed on a C-plane sapphire substrate using a photoresist, etched with an RIE apparatus until the cross section became a 2 µm deep square, whereby a substrate having a surface having concaves and convexes of a stripe pattern was obtained as shown in FIG. 2(a). The aspect ratio then of the cross section of the stripe groove was 1.

After removing the photoresist, the substrate was set on an MOVPE apparatus and the temperature was raised to 1100° C. under a gas atmosphere (main component nitrogen) to conduct thermal cleaning. The temperature was lowered to 500° C. and trimethyl gallium (hereinafter TMG) was flown as a III group starting material, and ammonia as an N starting material, whereby a GaN low temperature buffer layer having a thickness of 30 nm was grown.

Then the temperature was raised to 1000° C. and TMG and ammonia as starting materials and silane as a dopant were flown, whereby an n-type GaN layer (contact layer) was grown. The growth of the GaN layer was that burying the entirety, as shown in FIG. 2(b), occurring as a ridge-like crystal having a facet plane and an angle cross section, which was generated from the upper surface of convex parts and the bottom surface of concave parts, without forming a cavity in the concave arts.

In the facet structure growth, when the C-plane of a GaN crystal completely disappeared and the top became a pointed convex, the growth conditions were changed to those rendering the growth in the lateral direction predominant (elevating growth temperature and the like), and a GaN crystal was grown in a thickness of 5 µm from the top surface of the sapphire substrate. To obtain a burying layer having a flat top surface, membrane growth in 5 µm thickness was necessary.

Subsequently, an n-type AlGaN clad layer, an InGaN light-emitting layer (MQW structure), a p-type AlGaN clad layer and a p-type GaN contact layer were successively formed to give an x·substrate for an ultraviolet LED having an emission wavelength of 370 nm. To expose an n-type contact layer, an etching processing, formation of an electrode and element separation were conducted to give an LED element.

The output of each LED chips (bare chip state, wavelength 370 nm, current flown 20 mA) obtained from the whole wafer was measured.

As Comparative Example 1, an ultraviolet LED chip was formed under similar conditions as above except that concaves and convexes in stripes were not formed on a sapphire substrate (namely, an element structure was formed on a flat sapphire substrate via a low temperature buffer layer), and the output thereof was measured. The results of the measurements are as described in the following.

Comparative Example 2

In this Comparative Example, a lateral growth method was applied using a conventionally known mask to achieve reduction of dislocation density of the GaN group crystal layer in the above-mentioned Comparative Example 1. This Comparative Example 2 is a known constitution burying the mask at once with a single composition without-changing the composition during growth of a facet structure, and is vastly different from the embodiment (particularly FIG. 5(b)) of the present invention (II) in that it does not have a concavo-convex refractive index interface from the growth of a facet structure.

A C-plane sapphire substrate of the same specification as in Example 1 was set on an MOVPE apparatus and the temperature was raised to 1100° C. under a gas atmosphere (main component nitrogen) to conduct thermal cleaning. The temperature was lowered to 500° C. and TMG was flown as a III group starting material, and ammonia as an N starting material, whereby a GaN low temperature buffer layer having a thickness of 30 nm was grown.

Then the temperature was raised to 1000° C. and TMG and ammonia as starting materials and silane as a dopant were flown, whereby an n-type GaN layer (ca. 2 µm) was grown.

The substrate was taken out from the MOVPE apparatus, a stripe pattern (width 2 µm, period 4 µm, stripe-orientation: the longitudinal direction of the stripe is <11-20> direction for GaN crystal) was formed using a photoresist, and a 100 nm thick SiO$_2$ was deposited with an electron-beam deposition apparatus. The photoresist was removed by a method called a Lift-Off Method to give a stripe-like SiO$_2$ mask.

The substrate was again set on the MOVPE apparatus and an n-type GaN crystal contact layer was grown. The growth conditions were almost the same as in Example 1, and the growth was continued after the growth from the exposed part of the GaN crystal (non-masked region) occurred as a ridge-like crystal having a facet plane and an angle cross section until it was flattened burying the whole. For burying, growth in about 5 µm thickness of GaN crystal in the C-axis direction was necessary.

Subsequently, an n-type AlGaN clad layer, an InGaN light-emitting layer (MQW structure), a p-type AlGaN clad layer and a p-type GaN contact layer were successively formed to give an epitaxial substrate for an ultraviolet LED having an emission wavelength of 370 nm. Furthermore, to expose the n-type contact layer, an etching processing, formation of an electrode and element separation were conducted to give an LED element.

The output of each LED chips (bare chip state, wavelength 370 nm, current flown 20 mA) obtained from the whole wafer was measured. The measurement results are as shown later.

Example 2

In this Example, a concavo-convex facet structure comprising an AlGaN crystal was formed by said facet growth method according to the above-mentioned embodiment (II), as shown in FIG. 1(b), which was buried in GaN to give a concavo-convex refractive index interface, whereby a GaN group LED was actually prepared.

In completely the same manner as in Example 1, stripe patterned concaves and convexes were formed on a C-plane sapphire substrate, which was set on an MOVPE apparatus, and the temperature was raised to 1100° C. under a gas atmosphere (main component nitrogen) to conduct thermal cleaning. The temperature was lowered to 500° C. and TMG was flown as a III group starting material, and ammonia as an N starting material, whereby a GaN low temperature buffer layer having a thickness of 30 nm was grown.

Then the temperature was raised to 1000° C. and TMG and ammonia as starting materials, whereby a GaN layer was grown in about 100 nm. Then trimethylaluminum (TMA) was added to the III group starting material and the growth was continued, whereby AlGaN was grown. The growth of the AlGaN/GaN layer was that burying the entirety, as shown in FIG. 2(b), occurring as a ridge-like crystal having a facet plane and an angle cross section, which was generated from the upper surface of convex parts and the bottom surface of concave parts, without forming a cavity in the concave parts.

In the facet structure growth, when the C-plane of the AlGaN crystal completely disappeared and the top became a pointed convex, the growth conditions were changed to those for n-type GaN growth that rendered the growth in the lateral direction predominant, whereby an n-GaN crystal (contact layer) was grown in a thickness of 5 µm from the top surface of the sapphire substrate.

In completely the same manner as in Example 1, an n-type AlGaN clad layer, an InGaN light-emitting layer (MQW structure), a p-type AlGaN clad layer and a p-type GaN contact layer were successively formed on the n-type GaN contact layer to give an epitaxial substrate for an ultraviolet LED having an emission wavelength of 370 nm. Furthermore, to expose the n-type contact layer, an etching processing, formation of an electrode and element separation were conducted to give an LED element.

The output of each LED chips (bare chip state, wavelength 370 nm, current flown 20 mA) obtained from the whole wafer was measured. The measurement results are as shown later.

Example 3

In this Example, a concavo-convex facet structure comprising a GaN crystal was formed by said facet growth method according to the above-mentioned embodiment (II), as shown in FIG. 4(c), which was covered with 50 pairs of Bragg reflective layers having an AlGaN/GaN superlattice structure to give a concavo-convex multi-layer refractive index interface, whereby a GaN group LED was actually prepared.

In completely the same manner as in Example 1, stripe patterned concaves and convexes were formed on a C-plane sapphire substrate, which was set on an MOVPE apparatus, and the temperature was raised to 1100° C. under a gas atmosphere (main component nitrogen) to conduct thermal cleaning. The temperature was lowered to 500° C. and TMG was flown as a III group starting material, and ammonia as an N starting material, whereby a GaN low temperature buffer layer having a thickness of 30 nm was grown.

Then the temperature was raised to 1000° C. and TMG and ammonia as starting materials, whereby a GaN layer was grown as a ridge-like crystal having a facet plane and an angle cross section, which was generated from the upper surface of convex parts and the bottom surface of concave parts, as shown in FIG. 4(c).

In the facet structure growth, when the C-plane of the GaN crystal completely disappeared and the top became a pointed convex, 50 pairs of $Al_{0.2}Ga_{0.8}N$ (37 nm in C-axis direction)/GaN (34 nm in C-axis direction) were grown, after which the growth conditions were changed to those for n-type GaN growth that rendered the growth in the lateral direction predominant, whereby an n-GaN crystal (contact layer) was grown in a thickness of 5 μm from the top surface of the sapphire substrate.

In completely the same manner as in Example 1, an n-type AlGaN clad layer, an InGaN light-emitting layer (MQW structure), a p-type AlGaN clad layer and a p-type GaN contact layer were successively formed on the n-type GaN contact layer to give an epitaxial substrate for an ultraviolet LED having an emission wavelength of 370 nm. Furthermore, to expose the n-type contact layer, an etching processing, formation of an electrode and element separation were conducted to give an LED element.

The output of each LED chips (bare chip state, wavelength 370 nm, current flown 20 mA) obtained from the whole wafer was measured.

The measurement results (average value) of the above-mentioned Examples 1–3 and Comparative Examples 1, 2 are as follows.
Example 1: 14 mW.
Example 2: 14.5 mW.
Example 3: 15 mW.
Comparative Example 1: 6 mW.
Comparative Example 2: 7 mW.

As is clear from the comparison of the above, by forming a concavo-convex refractive index interface downward of the light-emitting layer, a part of the light in the lateral direction, which disappeared within the element, could be taken out and the output of the light-emitting element was found to have been improved.

Example 4

In this Example, a GaN group LED having a quantum well structure was prepared as an embodiment wherein the layer between the light-emitting layer and the crystal substrate comprised GaN alone.

A stripe pattern (width 2 μm, period 4 μm, stripe orientation: the longitudinal direction of the stripe is <11-20> direction for GaN group crystal grown on the substrate) was formed on a C-plane sapphire substrate using a photoresist, etched with an RIE apparatus until the cross section became a 2 μm deep square, whereby a substrate having a surface having concaves and convexes of a stripe pattern was obtained. The aspect ratio then of the cross section of the stripe groove was 1.

After removing the photoresist, the substrate was set on an MOVPE apparatus and the temperature was raised to 1100° C. under a nitrogen atmosphere to conduct thermal etching. The temperature was lowered to 500° C. and trimethyl gallium (hereinafter TMG) was flown as a III group starting material, and ammonia as an N starting material, whereby a GaN low temperature buffer layer having a thickness of 30 nm was grown. The GaN low temperature buffer layer was formed only on the top surface of the convex part and the bottom surface of the concave part.

Then the temperature was raised to 1000° C. and TMG and ammonia were flown as starting materials, whereby an undoped GaN layer was grown for the time corresponding to 2 μm on a flat substrate, and then the growth temperature was raised to 1050° C. and the GaN layer was grown for the time corresponding to 4 μm on a flat substrate. When growth is conducted under such conditions, the growth of GaN layer then results in a ridge-like crystal having a facet plane and an angle cross section, which was generated from the upper surface of convex parts and the bottom surface of concave parts, as shown in FIG. 2(b). By changing the growth temperature thereafter, a two-dimensional growth is promoted and the GaN layer is flattened.

Subsequently, a three-cycle multiple quantum well layer comprising an n-type GaN contact layer (clad layer), a 3 nm-thick InGaN well layer (emission wavelength 380 nm, In composition was near nil, making measurement difficult), and a 6 nm-thick GaN barrier layer, a 30 nm-thick p-type AlGaN clad layer, a 50 nm-thick p-type GaN contact layer were successively formed to give an ultraviolet LED wafer having an emission wavelength of 380 nm, which was followed by formation of an electrode and element separation to give an LED element.

The output of each LED element (bare chip state), wavelength 380 nm, current flown 20 mA) obtained from the hole wafer was measured.

For comparison, an ultraviolet LED chip (Comparative Example 1) was formed on a sapphire substrate free of concavo-convex processing under the conditions similar to those in the above and the output was measured.

In addition, an ultraviolet LED chip (Comparative Example 2) was formed on a typical substrate for ELO (GaN layer is once formed on a flat sapphire substrate, and a mask layer is formed) under the same conditions as above, and the output was measured.

The results of the average value of dislocation density in the LED wafer as measured by cathode luminescence, an average value of the output, and the life in an accelerated test at 80° C., 20 mA (time for decreasing to 80% of the initial output) are shown in Table 1.

TABLE 1

|  | Dislocation density (dislocations/cm$^2$) | Output (mW) | Life (hr) |
|---|---|---|---|
| Example | $8 \times 10^7$ | 10 | 1300 |
| Comparative Example 1 | $1 \times 10^9$ | 3 | 800 |
| Comparative Example 2 | $8 \times 10^7$ | 6 | 1300 |

As is clear from Table 1, in this Example, the dislocation density is reduced and long life and high output could be achieved. As is clear from Comparative Example 2, while the dislocation density could be reduced by ELO method, which is one of the dislocation density reduction methods, the output was lower as compared to this Example. This is considered to be attributable to difference in the crystallinity caused by the presence of a re-growth interface. In addition, since dislocation density on the substrate was generally high, both the output and the life were poor as compared to this Example.

Example 5

In this Example, an ultraviolet LED chip was prepared In the same manner as in Example 4 except that an n-type $Al_{0.1}Ga_{0.9}N$ clad layer was formed between the n-type GaN contact layer and the InGaN well layer in Example 4, and the output thereof was measured.

As shown in the above-mentioned Table 1, the output of the element of Example 4 was 10 mW, whereas the output of the element of this Example was 7 mW. This result has clarified that the element of this Example shows an increased output as compared to Comparative Examples 1, 2, and by removing the AlGaN layer from the InGaN well layer and the crystal substrate as in Example 4, the output could be further improved.

Example 6

In this Example, an experiment to examine the action and effect of a limitation relating to the thickness of the barrier layer of an MQW structure was conducted.

A GaN group LED was prepared in the same manner as in the above-mentioned Example 4 except that the thickness of each barrier layer of the MQW structure in Example 4 was set to sample 1; 3 nm, sample 2; 6 nm, sample 3; 10 nm, sample 4; 15 nm and sample 5; 30 nm. These all belong to the light-emitting element of the present invention.

The output of the UV LED chip was measured under the same conditions as above.

The average values of these measurement results are as follows.

Sample 1; 2 mW,
Sample 2; 7 mW,
Sample 3; 10 mW,
Sample 4; 8 mW,
Sample 5; 5 mW, These samples were subjected to a photoluminescence measurement at a low temperature of 4K, the luminescence from Mg was observed around 3.2 eV in sample 1. This is considered to be the results of diffusion of Mg from a p-type layer due to a thin barrier layer.

As is clear from the above-mentioned results, the high output can be improved at the barrier layer thickness of 6 nm–30 nm.

INDUSTRIAL APPLICABILITY

As mentioned above, by forming a concavo-convex refractive index interface downward of the light-emitting layer, the direction of progress of at least a part of the light in the lateral direction, which is produced in a light-emitting layer, could be changed, and further, the amount of the light could be increased.

It has been made possible to provide a light-emitting element having a novel structure that permits entry of the light into a sapphire substrate, while suppressing the occurrence of a standing wave in the vertical direction, and particularly improves the light-extraction efficiency from the substrate side.

Moreover, by forming a crystal structure on a substrate processed to have concaves and convexes, reduction of dislocation has been designed, by making the material of an n-type clad layer (also a barrier layer in quantum well structure) GaN, reduction of dislocation has been aimed, and by limiting the thickness of a barrier layer in a preferable embodiment of the MQW structure, the emission output of the element has been increased, thereby achieving a long life.

This application is based on patent application Nos. 081447/2001 and 080806/2001 filed in Japan, the contents of which are all hereby incorporated by reference.

The invention claimed is:

1. A GaN group semiconductor light-emitting element having an element structure comprising
    a first crystal layer, which is a sapphire substrate processed to have concaves and convexes on its surface wherein the concaves have a depth of 0.2 μm to 5 μm,
    a second crystal layer directly formed thereon or formed via a buffer layer, burying the concaves and convexes, said second crystal layer being made from a GaN group semiconductor material having a different refractive index from the aforementioned crystal layer, wherein the second crystal layer is grown from each of the concaves and convexes processed on the surface of the crystal substrate, while forming a facet structure comprising a facet plane which bends the dislocation line extending in the C-axis direction from the substrate in the second crystal layer into the lateral direction, and continuously grown to make the surface flat, and
    a semiconductor crystal layer comprising a light-emitting layer laminated thereon.

2. The GaN group semiconductor light-emitting element of claim 1, wherein the concaves and convexes processed on the surface of the crystal substrate have a stripe pattern, and the longitudinal direction of the stripe is a <11-20> direction or a <1-100> direction of a GaN group semiconductor grown while burying them.

3. The GaN group semiconductor light-emitting element of claim 1, wherein the concaves and convexes have a cross sectional shape of a rectangular wave or a triangular wave.

4. The GaN group semiconductor light-emitting element of claim 1, wherein the difference between the refractive index of the first crystal layer and that of the second crystal layer at the wavelength of a light emitted from the light-emitting layer is not less than 0.05.

5. The GaN group semiconductor light-emitting element of claim 1, wherein the light-emitting layer is made of an InGaN crystal having a composition capable of generating an ultraviolet light.

6. The GaN group semiconductor light-emitting element of claim 1, wherein the second crystal layer is grown via a low temperature buffer layer on the concaves and convexes processed on the surface of the crystal substrate while burying the concaves and convexes, the light-emitting layer is a quantum well structure comprising a well layer made of InGaN and a barrier layer made of GaN, and all the layers between the quantum well structure and the low temperature buffer layer are made of a GaN crystal.

7. The GaN group semiconductor light-emitting element of claim 1, wherein the light-emitting layer is a quantum well structure comprising a well layer made of InGaN and a barrier layer made of GaN.

8. The GaN group semiconductor light-emitting element of claim 7, wherein the barrier layer has a thickness of 6 nm–30 nm.

9. A production method of a GaN group semiconductor light-emitting element comprising:
processing a surface of a sapphire substrate as a first crystal layer to have concaves and convexes on its surface wherein the concaves have a depth of 0.2 μm to 5 μm,
forming a second crystal layer directly on the first crystal layer or via a buffer layer,
burying the concaves and convexes, and
laminating at least one semiconductor crystal layer comprising a light-emitting layer on the second crystal layer,
wherein the second crystal layer comprises a GaN group semiconductor with a different refractive index from the first crystal layer, and
wherein the second crystal layer is grown forming convexes from both the concave surfaces and convex surfaces in the early stage of the growth to form a facet structure comprising a facet plane which bends the dislocation line extending in the C-axis direction from the substrate in the second crystal layer into the lateral direction, and is continuously grown to make the surface flat.

10. The production method of claim 9, wherein the concaves and convexes processed on the surface of the crystal substrate have a stripe pattern, and the longitudinal direction of the stripe is a <11-20>direction or a <1-100> direction of a GaN group semiconductor grown while burying them.

11. The production method of claim 9, wherein the concaves and convexes have a cross sectional shape of a rectangular wave or a triangular wave.

12. The production method of claim 9, wherein the difference between the refractive index of the first crystal layer and that of the second crystal layer at the wavelength of a light emitted from the light-emitting layer is not less than 0.05.

13. The production method of claim 9, wherein the light-emitting layer is made of an InGaN crystal having a composition capable of generating an ultraviolet light.

14. The production method of claim 9, wherein the light-emitting layer is a quantum well structure comprising a well layer made of InGaN and a barrier layer made of GaN.

15. The production method of claim 9, wherein the second crystal layer is grown via a low temperature buffer layer on the concaves and convexes processed on the surface of the crystal substrate while burying the concaves and convexes, the light-emitting layer is a quantum well structure comprising a well layer made of InGaN and a barrier layer made of GaN, and all the layers between the quantum well structure and the low temperature buffer layer are made of a GaN crystal.

16. The production method of claim 14, wherein the barrier layer has a thickness of 6 nm–30 nm.

* * * * *